US007603016B1

(12) United States Patent
Soref

(10) Patent No.: US 7,603,016 B1
(45) Date of Patent: Oct. 13, 2009

(54) SEMICONDUCTOR PHOTONIC NANO COMMUNICATION LINK APPARATUS

(75) Inventor: Richard A. Soref, Newton, MA (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 0 days.

(21) Appl. No.: 11/801,766

(22) Filed: Apr. 30, 2007

(51) Int. Cl.
*G02B 6/10* (2006.01)
(52) U.S. Cl. .................................. 385/129; 385/131
(58) Field of Classification Search ......... 385/129–132, 385/14; 438/31, 32
See application file for complete search history.

(56) References Cited

U.S. PATENT DOCUMENTS

| | | | |
|---|---|---|---|
| 4,789,642 A | 12/1988 | Lorenzo et al. | |
| 5,163,118 A | 11/1992 | Lorenzo et al. | |
| 5,354,709 A | 10/1994 | Lorenzo et al. | |
| 5,548,128 A | 8/1996 | Soref et al. | |
| 5,838,870 A | 11/1998 | Soref | |
| 6,888,175 B1 | 5/2005 | Wang et al. | |
| 6,897,471 B1 | 5/2005 | Soref et al. | |
| 6,995,076 B2 | 2/2006 | Wang et al. | |
| 7,200,302 B2* | 4/2007 | LoCascio et al. | 385/39 |
| 7,266,263 B2* | 9/2007 | Ahn et al. | 385/14 |
| 7,391,801 B1* | 6/2008 | Soref et al. | 372/92 |

OTHER PUBLICATIONS

Q. Xu et al., "Micrometre-Scale Silicon Electro-Optic Modulator", *Nature*, May 19, 2005, pp. 325-327, vol. 435.
J. Menendez et al., "Type-I Ge/Ge$_{1-x-y}$Si$_x$Sn$_y$ Strained-Layer Heterostructures with a Direct Ge Band Gap", *Applied Physics Letters*, Aug. 16, 2004, pp. 1175-1177, vol. 85.
J.T. Robinson et al., "Ultrasmall Mode Volume in Dielectric Optical Microcavities", *Physical Review Letters*, 2005, p. 143901, vol. 95.
R. Soref et al, "Advances in SiGeSn/Ge Technology", Invited Paper, Symposium L, *Materials Research Society Fall Meeting*, Boston MA, Dec. 30, 2006 (to be published).
L. Colace et al., "Ge on Si p-i-n Photodiodes Operating at 10 Gb/s", *Applied Physics Letters*, 2006, p. 101111, vol. 88.

(Continued)

*Primary Examiner*—Charlie Peng
(74) *Attorney, Agent, or Firm*—AFMCLO/JAZ; Gerald B. Hollins

(57) ABSTRACT

A CMOS compatible ten-gigabit-per-second region nanowaveguide included photonic communication link apparatus of low energy use per transmitted bit. An embodiment of the link includes an electrically pumped laser, an electro absorption modulator and a photodetector for the 1.5 to 2.0 micrometer infrared spectral region; omission of the separate electro absorption modulator is additionally disclosed. Each of these three nano-scale elements preferably includes active semiconductor crystal material situated in a preferably Silicon resonator within a nano-strip waveguide. The resonator is defined by dispersed resonator mirrors having tapered separation distance one dimensional photonic crystal lattice apertures of oxide holes or slots. Each of the three devices may be a semiconductor heterodiode pumped or controlled by laterally disposed wings enclosing the resonator to form a lateral PIN heterodiode for current injection or high E-field generation depending on bias and composition conditions selected.

38 Claims, 9 Drawing Sheets

1D Photonic Crystal

Bragg Reflectors

OTHER PUBLICATIONS

S.J. Koester et al., "Germanium-on-SOI Infrared Detectors for Integrated Photonic Application" *IEEE Journal of Selected Topics in Quantum Electronics*, Dec. 2006, pp. 1489-1502, vol. 12, No. 6.

M. Kim, Silicon-Based Quantum Well Laser, *Final Report on AFOSR Phase 1 STTR*, Quant Tera Corporation, Jun. 16, 2006 (unpublished).

J. Liu et al., "High-Performance Tensile-Strained Ge p-i-n Photodetectors on a Si Platform", *Applied Physics Letters*, 2005, p. 103501, vol. 87.

S. Jongthammanurak et al., "Large Electro-Optic Effect in Tensile Strained Ge-on-Si films", *Applied Physics Letters*, 2006, pp. 161115-1 to 161115-3, vol. 89.

P. Lalanne et al., "Two Physical Mechanisms for Boosting the Quality Factor to Cavity Volume Ratio of Photonic Crystal Microcavities", *Optics Express*, 2004, pp. 458-467, vol. 12.

S. Strauf et al., "Self-Tuned Quantum Dot Gain in Photonic Crystal Lasers", *Physical Review Letters*, 2006, p. 127404, vol. 96.

J.F. Liu et al., "Waveguide-Integrated Ge p-i-n Photodetectors on SOI Platform", Paper ThA2, *IEEE $3^{rd}$ International Conference on Group IV Photonics*, Ottawa CA, Sep. 14, 2006.

S.G. Cloutier et al., "Optical Gain and Stimulated Emission in Periodic Nanopatterned Silicon", *Nature Materials 2005*, pp. 887-891, vol. 4.

S.G. Cloutier et al., "Enhancement of Radiative Recombination in Silicon Via Phonon Localization and Selection-Rule Breaking", *Advanced Materials* (Wiley VCH-Verlag), 2006, pp. 841-844, vol. 18.

\* cited by examiner

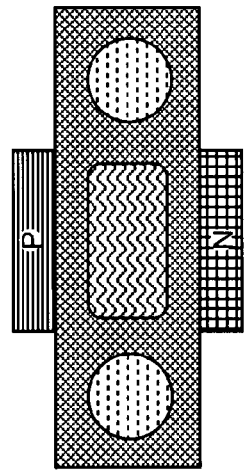
Photodetector: reverse-biased PIN heterdiode; active material is $Ge_{1-z}Sn_z$ with $0 < z < 0.16$
Fig. 4c
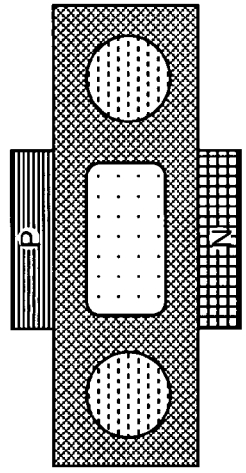
Modulator: reverse-biased PIN heterdiode; active material is $Ge_{1-y}Sn_y$ with $0 < y < 0.05$
Fig. 4b
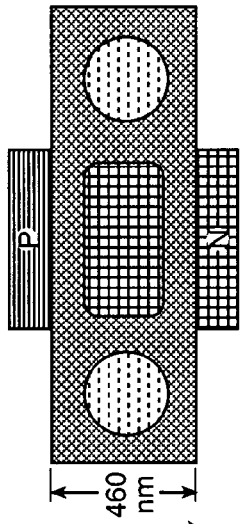
Laser: forward-biased PIN heterdiode; active material is $Ge_{1-x}Sn_x$ with $0 < x < 0.1$
|← 460 nm →|
Fig. 4a
Fig. 4
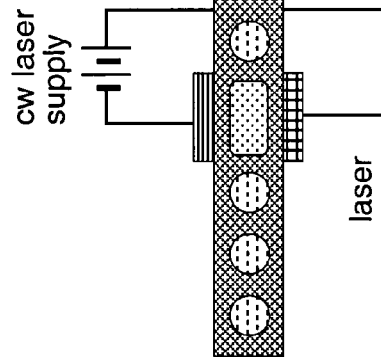
Fig. 5

SEMICONDUCTOR PHOTONIC NANO COMMUNICATION LINK APPARATUS

RIGHTS OF THE GOVERNMENT

The invention described herein may be manufactured and used by or for the Government of the United States for all governmental purposes without the payment of any royalty.

BACKGROUND OF THE INVENTION

Achieving chip-to-chip and intra-chip photonic interconnects in Silicon on insulator (SOI) complementary metal oxide semiconductor (CMOS) and in BiCMOS presents an extreme challenge to active photonic devices because the energy used in the optical communication link of such devices is desirably less than 100 femto Joules ($10^{-15}$ Joules) per data bit transmitted. This is the energy dissipated by the coupled photonic link comprised of a continuous wave laser, a fast modulator and a photodetector. As devices become optimized, this energy should be "down-scalable" year-by-year. This link constraint, may also be expressed in terms of milliwatts per Gigabit of communicated data and is a key to making photonic interconnects superior to copper interconnects. A solution to this photonic link problem resides in a nano photonic approach in which the on-chip electrically pumped lasers, the electro optical modulators, and the photo detectors all are (1) waveguide devices with a very small footprint, (2) devices with an ultra small mode volume, (3) devices with very good overlap between the fundamental mode and the active region of the device, and (4) devices with lateral P and N regions having lower mode loss than vertical P and N layers. This invention teaches the achievement of such devices in a Silicon-on-insulator platform that is fully compatible with state-of-the-art commercial CMOS processing. The invention also teaches the use of nanometer-scale optical resonators to enhance device performance and provide high quantum efficiency (wall-plug efficiency) that is essential to the interconnect application. The achieved devices are inherently fast, on the order of 10 Gigabits per second.

The prior invention of R. A. Soref as disclosed in U.S. Pat. No. 5,838,870, (Ref. 1) teaches the achievement of nano photonic devices that are suitable for intra- and inter-chip communication (FIG. 4 of the '870 patent). [Reference 1, (Ref. 1) etc., is listed at the close of this document.]. These devices however have several drawbacks. Specifically, (1) the vertical P-intrinsic-N (PIN) resonator within the one dimensional (1D) photonic-crystal waveguide includes a metalized air-bridge top contact that is not acceptable for optoelectronic integration in a CMOS manufacturing facility, (2) the P- and N-doped layers on the top and bottom of the waveguide, respectively, induce unwanted propagation losses, and (3) the active material chosen in the patent consists of "bulk" Silicon or Silicon quantum wells with high barriers, or SiGe quantum wells, i.e., devices that are difficult to make. With knowledge gained during the almost ten years ensuing since the '870 patent was filed, I now know that this set of materials is not optimum for the required lasing, modulation, and detection functions. For example, in "bulk" Silicon the optical gain produced during high carrier injection is slightly less than the free carrier absorption encountered.

The use of superior materials, all within periodic table group IV, is taught in the present photonic invention. I find that elemental Germanium, Ge, as well as alloys in the ternary family of Silicon, Germanium and Tin, SiGeSn, are preferred for the purposes of the achieved Franz-Keldysh modulation, for strong absorption within a detector, and for inherent gain that is larger than the induced free-carrier absorption. When embedded in Silicon waveguides, these active-materials create nano-hetero diodes such as Si/Ge/Si and Si/GeSn/Si in the present invention. Thus to summarize, the present invention offers significant improvement over the '870 patent in PIN integration, in waveguide transparency and in better-performing active devices.

SUMMARY OF THE INVENTION

The present invention therefore provides a small photonic signal coupling link apparatus achievable with conventional semiconductor fabrication steps.

It is another object of the invention to provide arrangements usable for coupled photonic signal generation, modulation and absorption.

It is another object of the invention to provide an improved three element semiconductor structure usable for photonic signal coupling functions.

It is another object of the invention to provide an improved two element semiconductor structure usable for photonic signal coupling functions.

It is another object of the invention to provide a plurality of semiconductor photonic structure alternatives and materials alternatives.

It is another object of the invention to provide a plurality of photonic signal coupling arrangements wherein semiconductor optical resonance contributes to the achieved coupling efficiency.

It is another object of the invention to provide a semiconductor photonic signal coupling device having electrical input and output signal ports.

It is another object of the invention to provide a resonant semiconductor photonic signal coupling device having a plurality of alternate resonant structure forms.

It is another object of the invention to provide an efficient, small and fast photonic signal coupling device usable for intra or inter chip signal coupling purposes.

It is another object of the invention to provide a photonic signal coupling device wherein a plurality of "engineered mirror" forms may be used to resonance advantage.

It is another object of the invention to provide a combination of Silicon, Germanium and Tin materials usable for improved photonic modulation, absorption and gain functions in a signal coupling device.

It is another object of the invention to provide a photonic signal coupling device having laterally displaced PIN heterodiode active elements.

It is another object of the invention to make resonator use of Germanium semiconductor grown in Silicon semiconductor trenches in a signal coupling environment.

It is another object of the invention to achieve coupled signal gain through use of Germanium materials.

It is another object of the invention to make use of the Franz-Keldysh modulation principle in a Germanium based laser modulation environment.

It is another object of the invention to provide for a two element nano photonic signal coupling element in which direct laser modulation eliminates the need for a discrete optical signal modulation element.

These and other objects of the invention will become apparent as the description of the representative embodiments proceeds.

These and other objects of the invention are achieved by nano-photonic communication link apparatus comprising the combination of:

an elongated optical waveguide member of selected infrared-wavelength-related length, width and depth nano-scale physical dimensions;

said optical waveguide member including a plurality of lengthwise dispersed periodic cavity apertures depth wise received therein and comprising an optically resonant waveguide cavity structure wherein successive groups of said cavity apertures form optical reflector elements;

said cavity apertures including periodic table group IV containing heterostructure filling material therein;

a plurality of central trench region rib-waveguide inclusive similar resonant wavelength characterized active transducer regions each of distinguishable material composition dispersed in end regions and central region lengthwise segregation along said optical waveguide member;

said transducer regions also including a resonant wavelength selecting one of a small composition difference material characteristic and a similar material composition with differing physical strain characteristic;

an end region one of said transducer regions comprising a laterally disposed electrically pumped PIN diode electroluminescent laser device optically coupling via said waveguide with remaining of said transducer regions;

laterally extending electron and hole injecting transducer electrical signal communicating wing member appendages contiguous each of said active transducer regions.

BRIEF DESCRIPTION OF THE DRAWINGS

The accompanying drawings incorporated in and forming a part of this specification, illustrate several aspects of the present invention and together with the description serve to explain the principles of the invention. In these drawings:

FIG. 4 shows the three views of FIG. 4a, FIG. 4b and FIG. 4c and illustrates the use of Germanium tin alloy materials in three differing resonant cavity locations of the present invention.

FIG. 5 shows a three element nano photonic communication link according to the present invention.

DETAILED DESCRIPTION

Figure 1:
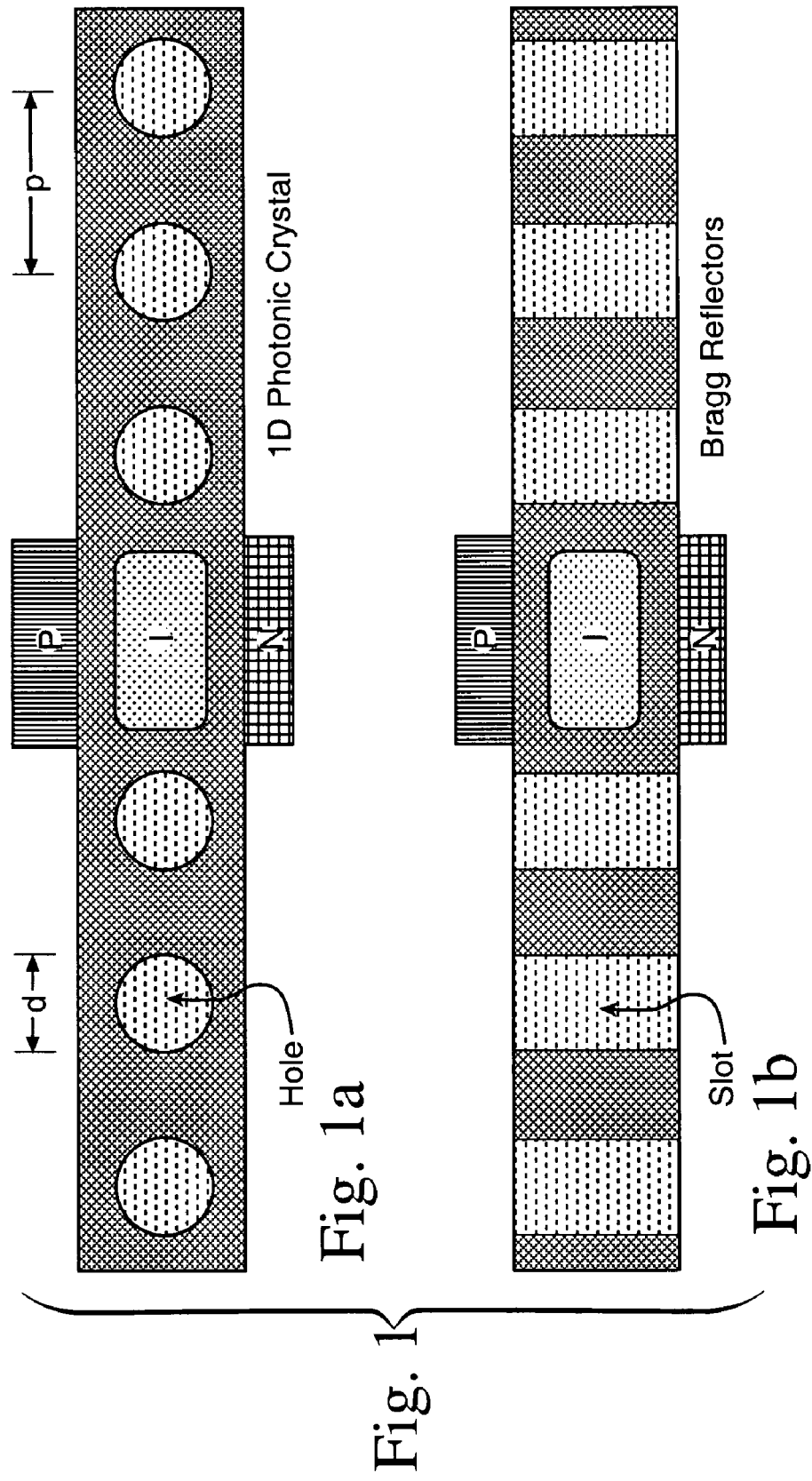
FIG. 1 includes the views of FIG. 1a and FIG. 1b and shows two PIN diode waveguide resonant structure arrangements relevant to the present invention.

In this invention, the basic structure for each photonic communication link device is a Silicon-on-insulator strip waveguide (i.e., a Silicon nanowire) that becomes a rib waveguide locally along a resonator length, such a waveguide is shown in the views of the FIG. 1 drawing. This FIG. 1 waveguide contains a one-dimensional photonic-crystal (PhC) structure providing a spaced pair of PhC reflectors defining an active micro cavity. Reflectors may be a set of air or oxide filled holes etched through the Silicon strip, or a set of deeply etched air or oxide filled slots that define Bragg-grating mirrors straddling the cavity. Typically, these holes and slots are filled with Silicon dioxide, $SiO_2$. The resonator is located in the hole-defect(s) or slot-defect(s) of the 1D lattice as shown in FIGS. 1a and 1b, respectively. The local rib regions do not disturb significantly the propagating mode in the SOI strip For the 1550 nanometer wavelength spectral region, the hole diameter, d, is approximately 200 nanometers, and the center-to-center hole spacing, p, is approximately 360 nanometers. The SOI strip width is about 460 nanometers and the Si height is about 400 nanometers to create single-mode propagation. The fabrication of semiconductor laser, modulator and photodetector devices of the type used in the present invention, using PIN diode included semiconductor structures, is discussed in a series of previously issued patents in which I am the, or one of the inventors; these patents are identified as U.S. Pat. No. 6,897,471; U.S. Pat. No. 5,838,870 and U.S. Pat. No. 5,548,128. These and the other patents identified herein and the identified reference technical publications [Ref. 1-18] are hereby incorporated by reference herein. Other incorporated by reference herein patents also include U.S. Pat. No. 4,789,642; U.S. Pat. No. 5,163,118; U.S. Pat. No. 5,354,709; I am a co-inventor identified on several of these patents also.

Figures 2, 2A, 2B:
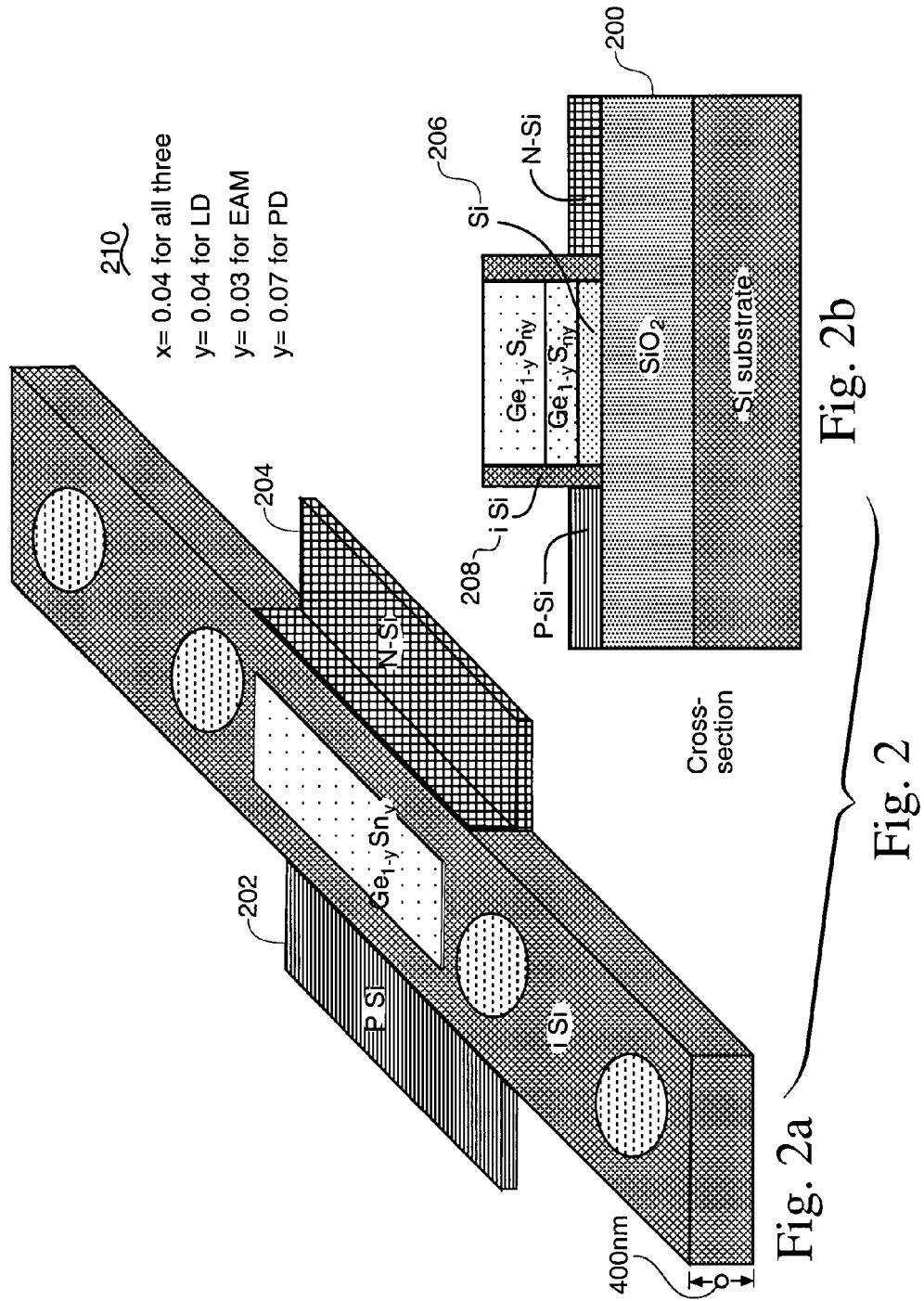
FIG. 2 includes the views of FIG. 2a and FIG. 2b and shows two present invention lateral PIN heterodiode waveguide resonant structure views.

Each present invention photonic device includes a lateral PIN diode structure of the type shown in the FIG. 1a oblique view and in the cross-section view of FIG. 2b. The actual length of each reflector in the FIG. 2 drawing has been truncated to show a closer view of the resonator. As also illustrated in FIG. 2b, each device may be constructed as a Silicon on insulator structure wherein the buried oxide thickness 200 is of the order of 1 micrometer. The resonator is locally a rib structure rather than a strip. The contacted resonator for the laser, modulator and detector consists of two Silicon "wings" 202 and 204, one doped to be P type at 202, and the other at 204 to be N type, that sandwich the cavity laterally. The P and N wings are individually contacted with metal as described below. Preferably, the height of each Si wing 202, 204 is less that the Si strip height, for example, the wing is 20 to 40% of the strip height so as not to perturb the propagating optical mode and induce extra loss within the waveguide. The FIG. 1 and FIG. 2 lateral PIN rib arrangement is demonstrated experimentally in a somewhat different setting by Lipson—in a micro ring resonator [Ref. 2].

In the FIG. 2 PIN device we may start with a waveguide thickness of 400 nanometers as shown in FIG. 2a then etch a rectangular hole that is 350 nanometers deep and leaves a 50 nanometer layer of Silicon at the hole bottom as appears at 206 in FIG. 2b. Then we may deposit a 100 nanometer layer 207 of $Germanium_{0.96}Tin_{0.04}$ (typical composition) in the rectangular hole onto the bottom Silicon 206, this $Germanium_{0.96}Tin_{0.04}$ material comprises a buffer layer 207. Then a 250 nanometers layer of Germanium Tin alloy, having the Tin content desired for the particular device, is deposited as represented at 208. These active device material compositions also appear at 210 in the FIG. 2 drawing and include differing percentages of Tin being used in the laser diode, the electro absorption modulator and the photo diode in order to achieve differing band gap shifts, differing stressing of the Germanium material and differing absorption spectra. These characteristics are subsequently harmonized for present invention purposes in the presence of operating bias voltages. Compositions for an alternate active device also appear at 1110 in the FIG. 11 drawing.

Additional details concerning the FIG. 2a and FIG. 2b drawings include in the rectangular trench a bottom layer composition of Silicon, a second layer of Germanium$_{0.96}$Tin$_{0.04}$ with the third layer being distinguished in each separate PIN diode structure of the invention as is shown in a subsequent paragraph for each of the diodes used.

In the laser diode the third layer is also Germanium$_{0.96}$Tin$_{0.04}$ with an indirect band gap at 620 milli electron volts, a direct band gap at 660 milli electron volts and a lasing wavelength of about 2.0 micrometers in the infrared region. In the electro absorption modulator diode the third layer is Germanium$_{0.97}$Tin$_{0.03}$ with an indirect band gap at 635 milli electron volts, and a direct band gap at 700 milli electron volts when no field is applied; thus there is little absorption at F=0. With field applied, the band gaps shrink by 50 millivolts giving strong absorption of the 2.0 micrometer laser light output as needed in an absorption modulator. In the photo diode the third layer is Germanium$_{0.93}$Tin$_{0.07}$ with an indirect band gap at 600 milli electron volts, and a direct band gap at 600 milli electron volts thus providing strong absorption of the 2.0 micrometers laser light output as desired in a photo diode transducer.

The preferred laser, modulator and detector used in the present invention are all capable of complete monolithic integration with CMOS electronics. The herein needed laser, modulator and detector are located within one photonic layer and that photonic layer is situated either above or below an electronic layer of related metal oxide Silicon field effect transistors, MOSFETs. One such transistor is assigned to each photonic device to actuate or control the device. A pair of "intimate" low-parasitic electrical leads may be used to connect a photonic device to a transistor. For example, with CMOS disposed below the photonics, two cylindrical holes or "vias" of approximately 300 nanometers diameter may be etched through the buried SiO$_2$—one immediately next to the P region and the other at the N region of a given device. The two vias may be filled with metal such as Al or Cu that contacts the P and the N regions separately and also contacts the active regions of an MOS field-effect transistor constructed below each resonator. With voltage across the P and N terminals, fields or currents are applied to each resonator segment.

The Si waveguide and the active rectangle shown in FIGS. 1 and 2 may be intrinsic (I) crystalline semiconductor material. In FIG. 2, the active portion is shown as Ge or GeSn, but is preferably SiGeSn. During forward bias of the PIN diode, both electrons and holes are injected into the active material; whereas, under reverse bias of the PIN, strong electric fields penetrate the active material, although this field is slightly non uniform in the vertical direction. The active material is grown in a circular or rectangular hole ("trench") in the hole-or-slot defect zone. The active material has a higher index-of-refraction, n, than the surrounding Silicon, for example, n=4.1 for GeSn versus n=3.5 for Si, in the 1500 nanometers range. Such materials are used in the FIG. 4 arrangement of the invention in the proportions illustrated. Due to the 0.6 step in refraction, there is a small added reflection, plus a bit of extra waveguide loss. However, the 0.6 group-IV refraction step is much smaller than the 2.1 refraction step of Si/SiO$_2$ in SOI, so the cavity step will effectively not prevent attainment of high Q for the described resonator. Also the Si and active material form a heterodiode, with conduction and valence band offsets, that are Type I or Type II, depending upon the cavity-material strain. If Type II, then electron or hole transport will be slightly inhibited during e+h injection, but this does not seriously degrade the radiative recombination in an emitter. Type I characteristic is achievable for tensile Ge upon SiGeSn [Ref. 3]. Type I means that electrons and holes are confined in the same layers, whereas Type II implies electron and hole confinement in separate, adjacent layers.

Of interest with respect to the present invention, Lipson and coworkers modeled and simulated the optical E-field concentration within a lower-index slot along the propagation direction in a Silicon on insulator strip guide [Ref. 4]. The longitudinal slot extends between two oxide-filled holes in a one dimensional PhC resonator, the slot being 20 nanometers wide and 160 nanometers long. Such a slot cavity has a volume of 0.077 $V_0$ where $V_0$ is the $(\lambda/2n)^3$ volume of a reference resonator (half a wavelength-of-light-in-Si on each dimension). With respect to the present invention the term "one dimensional" may be considered to mean an array of holes along one axis, rather than along two orthogonal axes.

Extrapolating from the Lipson oxide-slot result, it is therein tempting to confine the active SiGeSn here within a very-narrow slot width, H, ~20 nanometers in FIG. 1, in the hope of obtaining an ultra small volume for the gain material. However, since the index of the SiGeSn slot material is about 17% higher than the surrounding index of Si, not lower than the Si index as in Lipson, the field strength within the active slot will be only ~1.2 times what it would have been in uniform Silicon (not 10 or 20 times higher as it was in Lipson's oxide slot.) Also, the guided mode would not be well confined to the higher index 20-nm slot. As a result, the mode overlap, Γ, is only about 0.05 for the 20-nanometers/460-nanometers H/W of the present narrow-slot example. For these two reasons, we shall instead make that active slot width H approximately 80% of the strip width W so that Γ~0.8.

This H choice provides a resonator volume of approximately 1.4 $V_0$ for our present invention active diodes. If the resonator's spectral line width is narrower than the gain line width of the semiconductor material, as is likely here, then the spontaneous-emission enhancement, the Purcell factor, is proportional to $V_0/V_{eff}$ where $V_{eff}$ is the effective mode volume. With this ratio being approximately unity here, the Purcell enhancement may not be significant in our case. Nevertheless, our mode volume is ultra small by most standards and is quite comparable to that of a point-defect resonator in a 2D or 3D photonic lattice. To summarize, in the present embodiment for operation at the 1550 nanometers wavelength, the P-to-N electrode spacing is ~460 nanometers, the mode overlap is ~0.8, the active interaction length is ~150 nanometers, the resonator volume is ~150 nanometers×370 nanometers×350 nanometers, and the Silicon wing height is ~65 nanometers.

Now I shall consider the materials growth, the operating principles of each component and the alloy-and-resonator conditions employed to make all components function well together as a communication system. Finally, a preferred form for the PhC reflectors is described.

In principle, molecular beam epitaxy may be used to grow the active material for each component, but in practice, chemical vapor deposition (CVD) is to be preferred for the present invention, primarily because it is compatible with CMOS foundries. The Kouvetakis group at Arizona State University has demonstrated—using its unique chemical precursors—that GeSn and SiGeSn (both rich in Germanium) can be grown directly upon Silicon [Ref. 5]. In addition, it has been proven experimentally by the MIT group that crystal Germanium can be grown via ultra high vacuum CVD in a small Si trench, with good crystal quality for the Germanium, apart from dislocations at the lower Ge/Si interface. Extrapolating from both results, it appears that crystalline SiGeSn of high quality can be grown in the Si nano-cavities shown in the present invention. To form the cavity, a rectangular hole, nearly 400 nanometers in width, can be etched in the top Silicon down to the oxide, although the oxide at the bottom of the hole may not be optimum for deposited crystalline SiGeSn within the hole. Thus it may be necessary to leave a few nanometers of Silicon at the bottom of the cavity for "seeding" of the active SiGeSn material being deposited in the hole.

Literature is arising concerning Ge-in-Si growth for telecommunications CMOS photo-detectors. A recent example from the MIT group [Ref. 6] proves the use of UHCVD for 10 Gigabit/second Ge/Si PIN photodiodes. Regarding our present invention, lateral P and N electrodes, this arrangement has been proven experimentally by Koester et al [Ref. 7] for Germanium photo diodes and by Lipson [Ref. 2] for SOI resonators.

Figure 3:
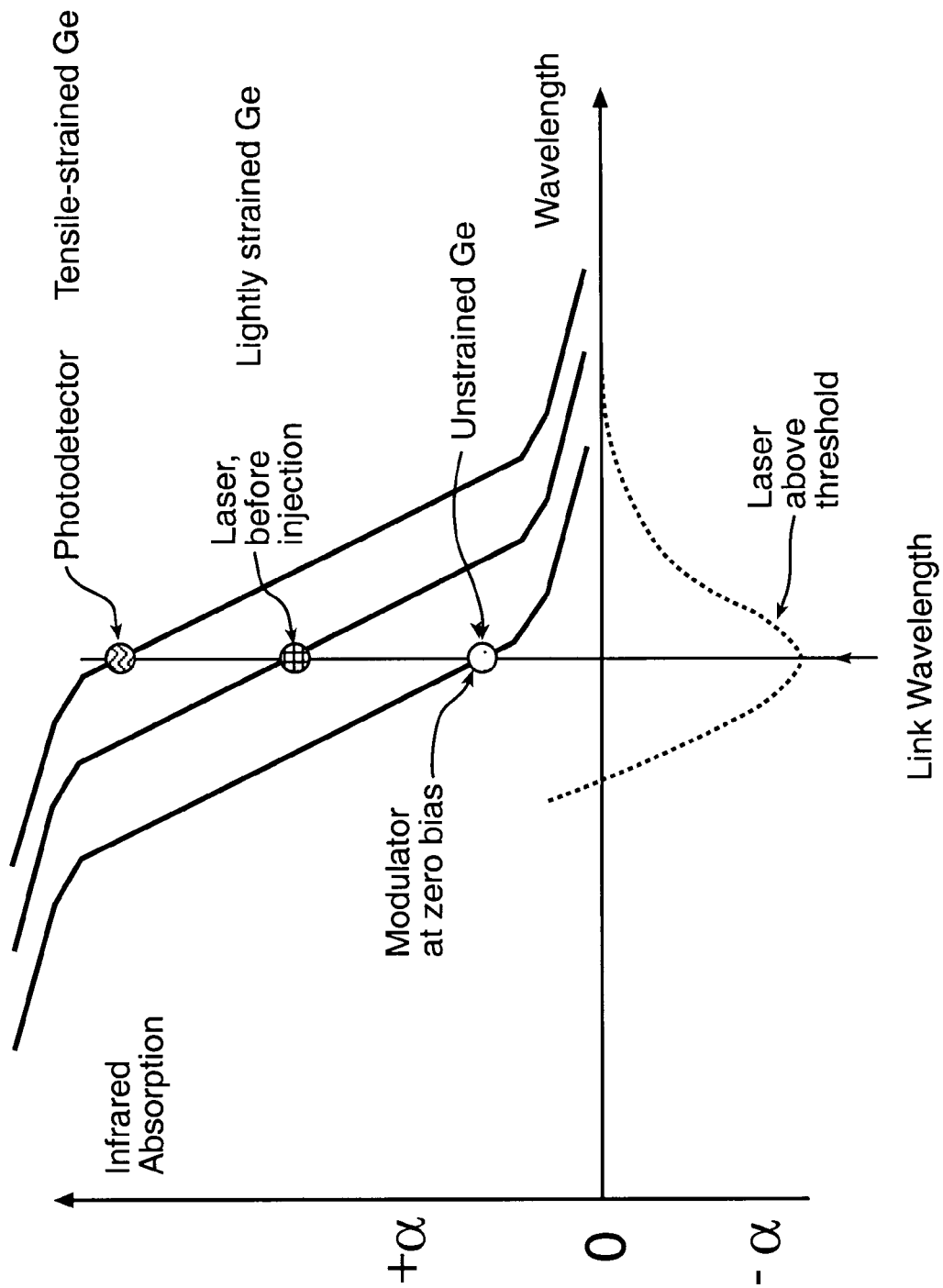
FIG. 3 shows infrared absorption spectra of Germanium used in a plurality of present invention related applications.

Generally the absorption spectra of the laser diode, the electro absorption modulator and the photo diode should be related in the present invention. The band gap of the electro absorption modulator is preferably selected such that the electro absorption modulator at the laser wavelength is low with the field off and high with the field on. The band gap of the photo diode is preferably selected to provide high absorption at the laser emission wavelength. FIG. 3 in the drawings shows an example of the desired relationship. Similar spectra apply to an active Ge1-ySny active region in each device, with y being different for each device.

The present invention therefore contemplates the achievement of intrinsic net gain under high electron and hole injection for the Germanium or GeSn laser PIN heterodiode (LD), high Franz-Keldysh PIN electro-absorption modulation (EAM) for the modulators, and an optically thick PIN heterodiode for the photodetector (PD). To achieve these conditions the continuous wave PIN heterodiode laser, the PIN electro-absorption modulator and the heterodiode for the photodetector must be compatible, that is, the modulator should have low loss at the laser wavelength in the modulator-off state, plus a high depth of modulation in the modulator-on state; while the detector must have strong absorption at the laser wavelength. As illustrated in FIG. 3 herein, the mutual functioning of LD, EAM and PD is determined by the infrared absorption spectrum of each device, mainly by the absorption "edge" of the spectral curve. Elemental Ge has an "almost direct" bandgap and unstrained GeSn has a direct-gap for 9% Sn or more [Ref. 8]. Thus the relevant absorption edge is moderately steep.

The present invention laser emission wavelength is represented by the vertical line in FIG. 3. The modulator and detector conform to the laser wavelength as shown. For the laser, we will be about halfway up the edge-curve given by laser alloy in the absence of carrier injection. When the laser is electrically pumped above its lasing threshold, its gain curve (illustrated as the lower α dotted curve in FIG. 3) peaks at the same wavelength, as shown by the vertical line. For the modulator, the operating point will be below the "half maximum" absorption because this entire curve shifts towards longer wavelengths during reverse bias operation. For the detector, we must be high up on the absorption edge, near the knee, in order to provide high quantum efficiency. Therefore, speaking qualitatively, we require the non pumped laser curve to be red shifted from the unbiased EAM curve, and the PD curve to be red shifted from the LD curve.

There are two ways to achieve the FIG. 3 relationships: (1) to use the same material, such as elemental Germanium, in each resonator, but to adjust the amount of tensile strain in each of three Germanium cavities, or (2) to utilize a different alloy composition in each resonator. Regarding strain, Kimerling's group at MIT has shown that Germanium deposited upon Silicon, when annealed at temperatures around 900 degrees Centigrade, will possess in-plane tensile strain due to the different thermal expansion coefficients of Germanium and Silicon [Ref. 9]. This technique may be used in the present invention by providing 0.12% strain for the Germanium laser and 0.25% strain for the Germanium photodetector (with the Germanium modulator being unstrained), that is, using a varied-strain distribution obtained by selecting the appropriate annealing temperature for each device. For the strained Germanium, an about 20 nanometers film of Silicon may be present at the bottom of each cavity. The lasing benefits of tensile Germanium—that the gamma conduction valley of Germanium moves downward in energy with increasing strain—leads to a direct band gap for sufficient tensile strain as reported in [Ref. 10].

A second present invention approach is to vary the concentration of Tin in the GeSn alloy used in each device. It is difficult to quantify the Tin contents precisely but three examples will illustrate the numerical approach. One example includes elemental Germanium for the EAM, $Ge_{0.96}Sn_{0.04}$ for the LD and $Ge_{0.92}Sn_{0.08}$ for the PD. Another example involves $Ge_{0.98}Sn_{0.02}$ for the EAM, $Ge_{0.91}Sn_{0.09}$ for the LD and $Ge_{0.85}Sn_{0.15}$ for the PD. The band gap of GeSn narrows sharply with increasing Sn, which explains the 15% Sn in the second example. A third example includes $Si_{0.06}Ge_{0.94}$ for the EAM, Ge for the LD and $Ge_{0.95}Sn_{0.05}$ for the PD. The laser wavelength is different in each example, but there is not a need to obtain exactly 1550 nanometers wavelength in the present communication link invention; the wavelength may be anywhere from 1500 nanometers to 2000 nanometers.

Our preferred laser uses a band-to-band laser transition in strained or unstrained GeSn gain material. During forward bias, both holes and electrons may be injected laterally into the laser GeSn at a high concentration of roughly $5 \times 10^{18}/cm^{-3}$. Our preferred modulator is a bulk-crystal EAM using the ultra fast F-K field effect in Germanium or Germanium-rich alloys. The MIT group recently demonstrated a Germanium-upon-Silicon waveguided FKE having a high figure of merit—a large induced change in absorption divided by the relatively small absorption (loss) of the waveguide [Ref. 11]. This is expected to give 10 Gigabit/second operation with applied voltages of less than 5V. Our preferred fast photodetector is a waveguide-integrated Germanium-rich absorber in which the infrared-generated electron-hole pairs are collected in the reverse-biased PIN heterodiode to produce photocurrent. Most of the incoming light is absorbed, and the responsivity is expected to be high.

FIG. 5 in the drawings illustrates the complete monolithically interconnected photonic communication link: LD to EAM to PD. This is the present invention "nano link." An electrical signal from a transistor is fed into the EAM which impresses the signal information on the continuous wave LD beam traveling to the PD, and then at the PD, this IR signal is demodulated and the electrical signal is recovered at that location for feeding to another transistor. This is how one high-speed transistor is interconnected with another optically. In addition to continuous wave operation, the laser heterodiode is of course capable of direct, internal modulation via modulation of its injection current. The RC time constant of this laser is extremely small, as is desirable.

Whether internal modulation of the LD is truly viable in the present invention nano link depends upon the speed, chirp and signal distortion of the internal LD modulation. There is some evidence that the 10 Gigabit/second speed criterion can be met with such internal modulation. If this becomes feasible in practice, then the modulator, the herein described EA modulator, can be eliminated from the link.

Figure 6:
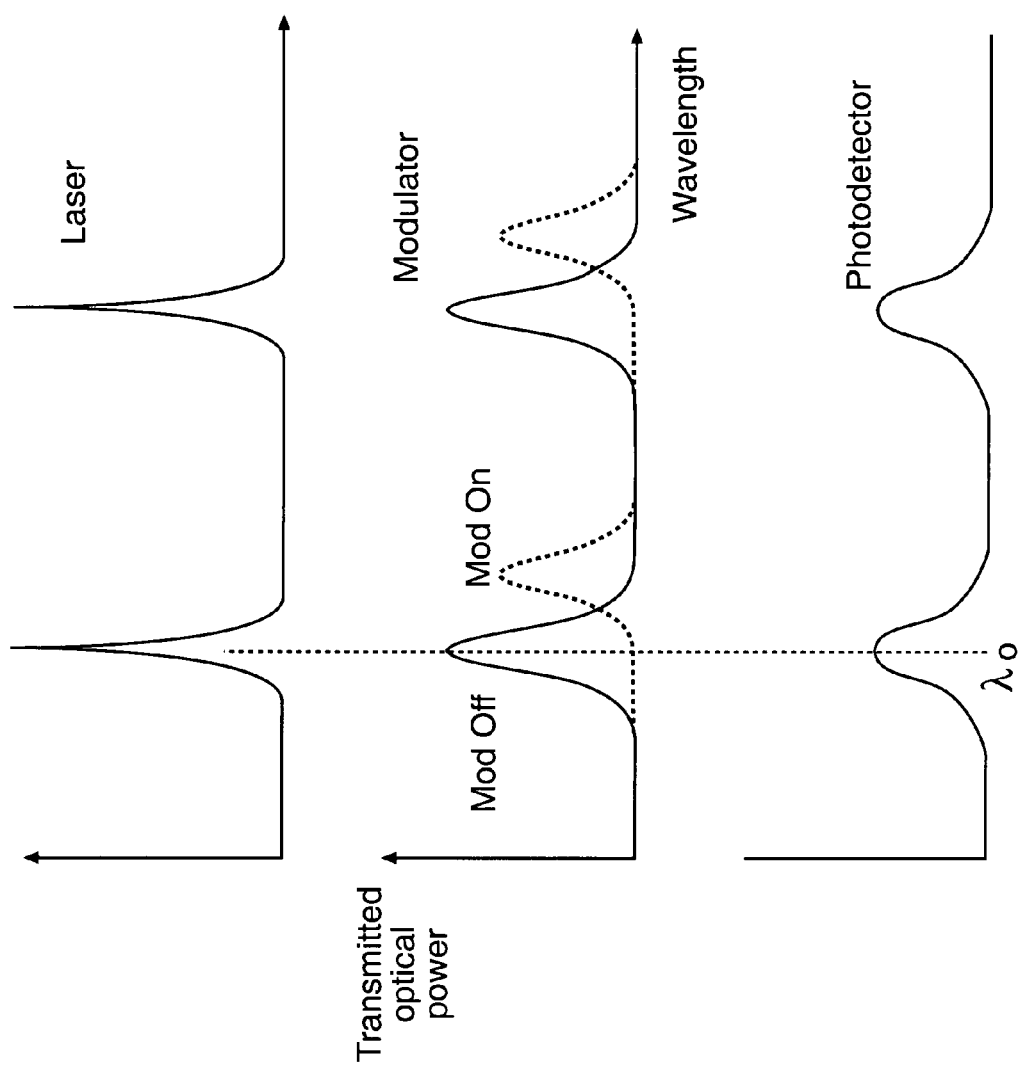
FIG. 6 shows spectral alignment of one mode in each resonator of a three element present invention nano photonic communication link.

Each active device in the present invention utilizes an infrared resonator and each device has multiple resonances. To provide mutual functioning of the three devices for a communications link, spectral alignment of one resonant mode in each device is required. This is illustrated in FIG. 6 by the vertical line at the operation wavelength, $\lambda_0$. FIG. 6 presents lineup of second modes to the right of $\lambda_0$ as well, but this is not actually required, only the lineup at $\lambda_0$ is needed. The initial loss in the EAM and in the PD will diminish the cavity Q in these two devices. This is why the LD cavity generally has a higher Q than the EAM and the PD. This relationship is actually helpful in achieving spectral alignment. All three cavities are "tunable" by their arrangement. FIG. 6 also shows by dotted lines how the EAM transmission shifts during E-field application, producing intensity modulation in the link.

Figure 7:
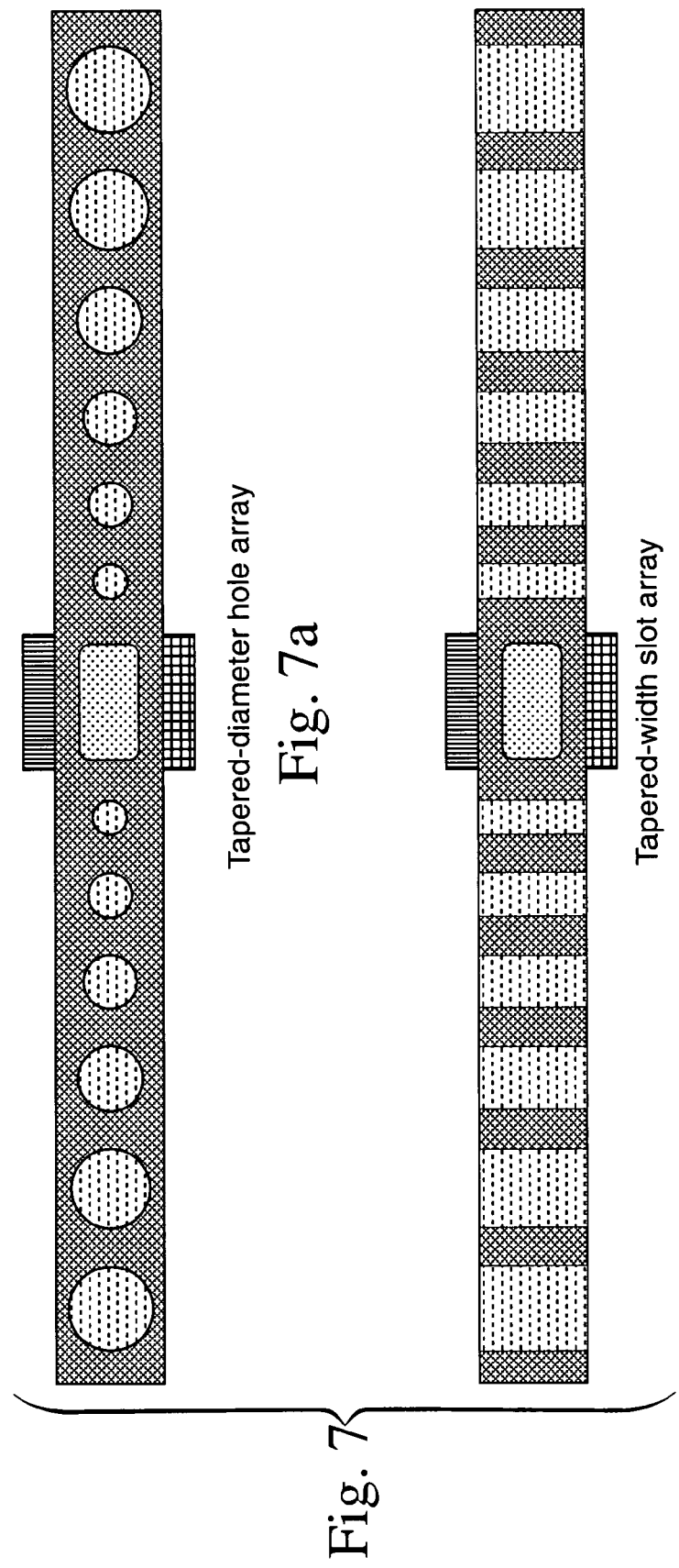
FIG. 7 includes the views of FIG. 7a and FIG. 7b and shows details of two engineered mirror forms for present invention resonators.

Obtaining a high Q of several thousand—as desired in the present invention—is not always easy on an SOI strip waveguide that contains "conventional" photonic-crystal mirrors because there is unwanted out-of-plane radiation and in some instances excess mirror losses ("conventional" here refers to a one-dimensional hole lattice with uniform size and spacing). The work of Lalanne et al [Ref-12] shows that by fine tuning the geometry of holes around the hole defect in the one-dimensional lattice, out-of-plane losses can be reduced and recycling of the mirror losses can be attained. This fine tuning involves hole separation tapering along the waveguide axis, as is illustrated in FIG. 7, and is a part of the preferred embodiment of the invention. This series of decreasing or increasing hole diameters along a waveguide length dimension may be described as successively tapered hole diameter elements located in sequence along said waveguide. Such tapering location is omitted in drawings preceding FIG. 7 for convenience in appreciating other aspects of the invention but is implied in each drawing of this type prior to FIG. 7. There are 6 or 7 successively different diameter holes of tapered separation distance in each of the "engineered mirrors" represented in FIG. 7a and FIG. 7b, so each device is several micrometers long. The physics of the "engineered mirrors" used in this invention is described in Lalanne in a discussion of his FIG. 6a. A similar reflector approach is seen in the GaAs laser cavity of [Ref. 13] within their two dimensional photonic air-hole lattice [FIG. 1a of Ref. 13]. The resonators here in FIGS. 1, 2 and 7 have a length defined by one missing hole or slot. However, two missing holes or even three missing holes can be used to form the resonators in this invention—if desired—to provide a longer path for gain.

In a three device waveguide of the present invention type each of the laser diode, electro absorption modulator and photo diode devices is provided with absorption characteristics harmonized for its intended function. In the FIG. 2 device it is desired for example to achieve direct gap characteristics in the upper layer tensile Germanium active material at 208 in order to achieve low absorption and high emission in the laser device. In contrast the electro absorption modulator device is shifted from low into a high absorption mode by applied electrical signal. Differing degrees of strain as achieved by the x and y values specified in the several drawings herein may be used in moving the material absorption into the red or blue and thus achieving the harmonized characteristics. Generally higher amounts of Tin achieve greater degrees of strain and absorption change in the Germanium material.

Alternative Link

I shall now describe an alternative embodiment of the nano-photonic communication link invention. This link consists of a lateral super lattice PIN laser diode, plus the same "bulk crystal" EAM and PD that are described above. In this alternative nano link, I shall now however expand the list of useful strip waveguide materials from SOI to include SiGeOI, (that is Silicon Germanium alloy on insulator) GeOI and GeSnOI. Infrared waveguiding is well known or "readily predicted" in these group-IV on insulator structures. The low loss waveguiding will occur at wavelengths longer than the indirect band-gap wavelength of the strip material (of Si or SiGe or Ge or GeSn). For photonic communication links in this invention, it does not matter whether the communicated wavelength is longer or shorter than 1550 nanometers, providing that the modulator and detector function well at the employed wavelength.

Regarding the optoelectronic integration of SOI, SGOI, GOI and GTOI, (SiGe on insulator, Ge on insulator and GeSn on insulator) it has been proven by the BAE systems team that a layer of waveguiding Si (and by extension SiGe or Ge or GeSn) can be deposited on a $SiO_2$ film that covers a CMOS SOI substrate [Ref. 14]. For this 3D optoelectronic integration in the present invention, the group IV waveguiding layer is preferably deposited as dense nano crystalline Silicon or SiGe or Germanium or GeSn.

Now I describe a super lattice laser embodiment of the present invention. This is a "one material alternative" to the hetero structure laser described above. For example, the strip waveguide and the laser cavity can both be made of Ge, with a lateral super lattice consisting of air-filled or, as shown, oxide-filled pores or cylindrical holes. More generally, the lasing material is intrinsic Si or SiGe or Ge or GeSn. The resulting laser is illustrated in the oblique view, FIG. 8a, of FIG. 8 with a cross sectional view appearing in FIG. 8b. There are two rib "wings" that locally straddle the super lattice gain region and the wings are made of the same material as the laser. The super lattice with a small pore diameter of about 60 nanometers is formed in both the photonic crystal resonator and the wings by for example, using a procedure developed by Xu and Cloutier at Brown University [Ref. 15]. The FIG. 8 apparatus may also be fabricated in the forms of SiGe on insulator, Ge on insulator and GeSn on insulator. In the FIG. 8 device all of the illustrated parts may include the same underlying material such as Silicon or one of these materials.

The principle of lasing as accomplished in the present invention has been discussed by Sylvain Cloutier in his Advanced Materials article [Ref. 16], wherein he shows that phonon confinement effects in a short-period lateral super lattice lead to a greatly enhanced radiative recombination at room temperature. The super lattice laser provides (1) nano localization of the injected carriers at the wing/strip interfaces—which serves to spread the electron and hole wave functions in k-space, thereby increasing the electron-hole radiative recombination rate, and (2) nano localizing of the group IV gain material into about 60 nanometers-diameter irregular pillars—which similarly relaxes the phonon-assistance rule of the laser emission. The laser utilizes excitons, and thus the wavelength of emission is slightly longer than the indirect band gap (or the direct band gap) wavelength, whichever is longer: for example, 1.22 micrometers for Si, 1.4 micrometers for SiGe, 1.7 micrometers for Ge and 1.9 micrometers for GeSn. The pore diameter in the self-assembled super lattice is about a factor of four smaller than that in a conventional 2D photonic crystal. Such nano pores give the desired high concentration of radiative (infrared active) defects in the Group IV super lattice. Notably not all aspects of the super lattice photonic communication link device are fully understood in the art however desirable results are nevertheless obtainable empirically.

Figure 8:
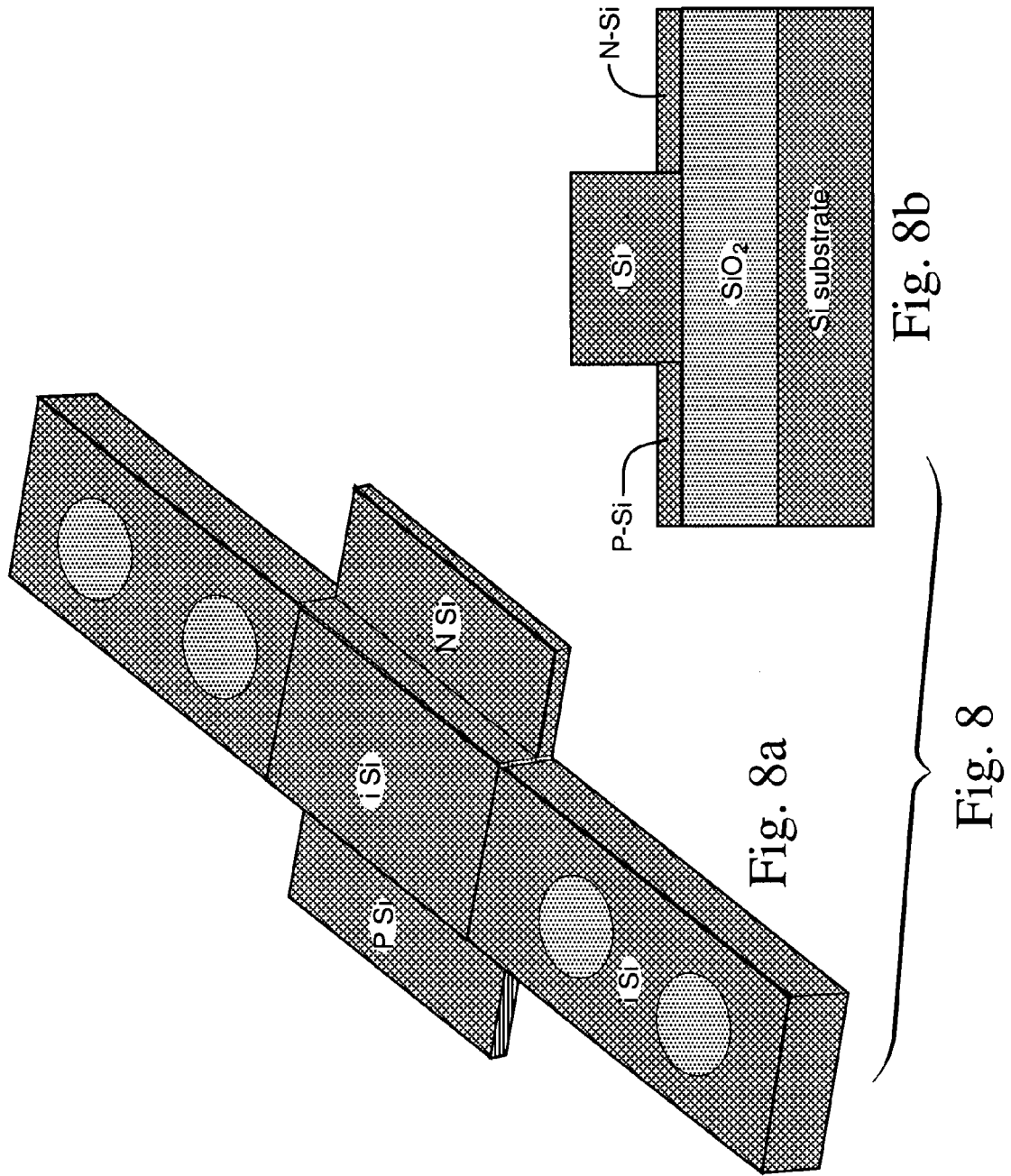
FIG. 8 includes the views of FIG. 8a and FIG. 8b and shows two super lattice laser views relating to the present invention.
Figure 9:
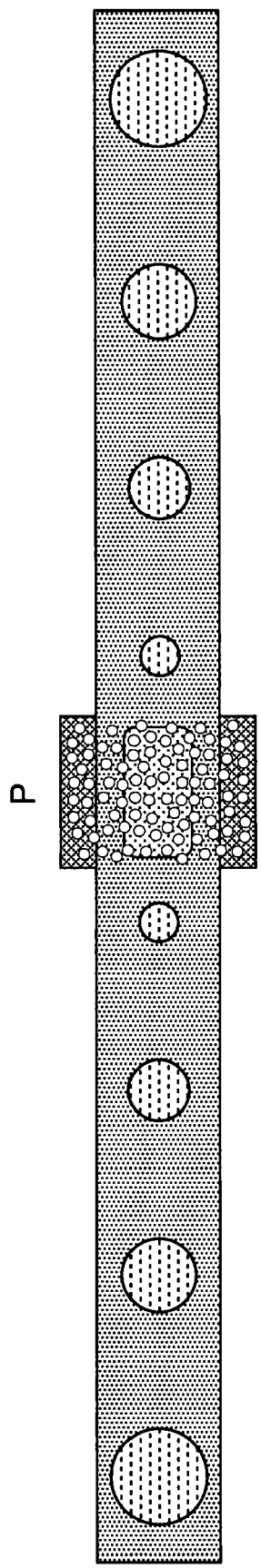
FIG. 9 shows a top view of a laser with engineered mirrors usable in the present invention.

The electrically pumped laser of the present invention uses lateral PIN injection of both electrons and holes into the intrinsic SiGeSn active region or gain region of the strip waveguide. The wings shown in FIG. 8 are arranged not to introduce significant loss into the single mode strip waveguide. The injected concentration of electrons and holes is high, in the range of $10^{18}$ to $10^{19}$ per $cm^3$. The photonic crystal mirrors in FIG. 9 are also "engineered" as before, with tapered-size holes or slots. This gives high Q in the laser cavity (Q>2000) and low loss in the waveguide. The tapered size holes or slots are preferred in several drawings of this document including the FIG. 1 and FIG. 7 drawings. These tapered-size holes comprise the waveguide resonator and may be fabricated either prior to or subsequent to the active parts shown in FIG. 2. The resonator is comprised of a periodic series of holes or slots or other apertures penetrating the waveguide strip. One or more of these holes or slots are missing in the series and the resonant cavity is located where one, two or three holes are missing; this arrangement may be identified as a line defect in a one dimensional photonic lattice. Solid semiconductor is present where the holes are missing, and the hole arrays on the two sides of the solid constitute two reflectors. The infrared interference between the reflectors creates the desired resonances.

The present invention preferred one dimensional lattice waveguide includes two series of different progressively tapered diameter holes or slots as appear in FIG. 7*a* and FIG. 7*b* of the drawings. These hole sets constitute an engineered mirror and provide a high Q characteristic and low optical loss in the resonant cavity.

Figure 10:
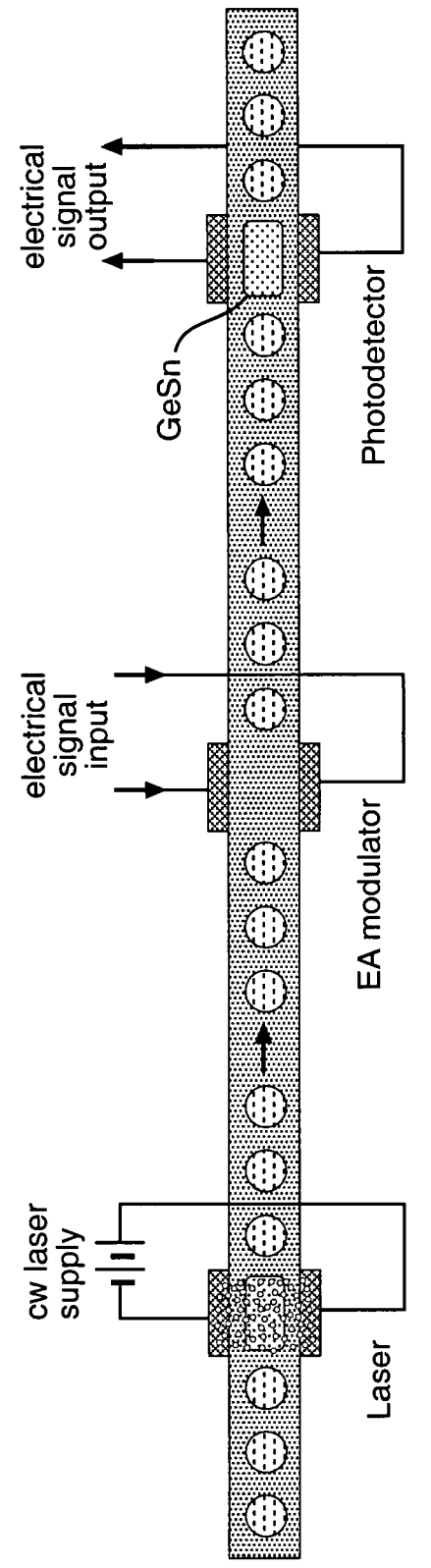
FIG. 10 shows an alternate nano photonic link using a super lattice laser.

Turning now to the nano link, I show in FIG. 10 an engineered mirror super lattice laser that is monolithically integrated in the same strip waveguide with the EAM and PD. Generally, the active alloy material in each device will be slightly different, for example, a differing Germanium content in GeSn. Here in FIG. 10, I show the example of a Germanium on insulator waveguide. In this case, the EAM preferably also uses Germanium in its active resonator, or GeSn with 2% Sn, whereas the resonator in the PD employs GeSn having about 4% Sn concentration. In the FIG. 10 embodiment of the invention the phonon-assistance rule for radiative recombination is relaxed because of nano-localized carrier injection presence and nano-scale pillars of Silicon or Germanium being present.

Figure 11:
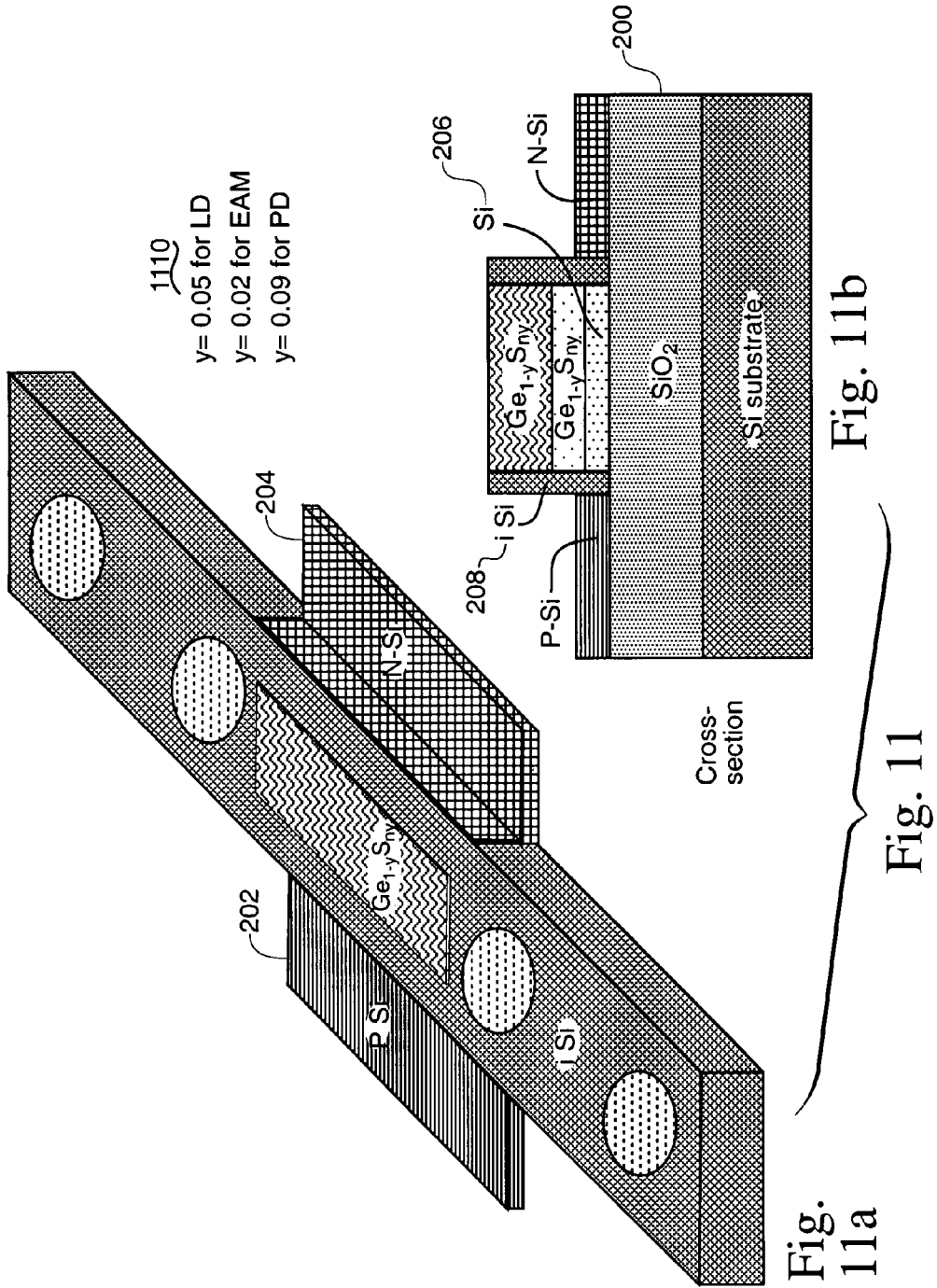
FIG. 11 includes the views of FIG. 11a and FIG. 11b and shows two alternate arrangements relating to the present invention.

Thus an alternative but less desirable arrangement of the present invention includes an active region consisting of three layers shown in FIG. 11*b* including a Silicon layer at the bottom of the trench, an unstrained Germanium-Tin buffer layer upon the Silicon (this buffer having a larger atomic lattice parameter than Ge) and then a tensile Germanium layer on the Germanium-Tin. The Tin content in this arrangement is selected to provide the desired degree of strain and the desired band gap in the Germanium for the device being considered. Material percentages for the buffer, for the laser diode and the electro absorption modulator and photo diode appear in the FIG. 11 drawing.

In conclusion I have disclosed a ten gigabit per second waveguided Silicon and other materials on insulator photonic communication link operating with very low power per bit transmitted in an intra-chip CMOS photonic interconnect. The nano-photonic link may consist of an electrically pumped continuous wave laser, an electro absorption modulator and a photodetector for the 1.5 to 2.0 micrometer wavelength spectral region. Each of these three nano-scale devices for example, uses an active Silicon Germanium Tin crystal material that is situated in a nano resonator within a Silicon on insulator strip waveguide. The resonator is defined by two "engineered mirrors" each of which is comprised of an array of oxide holes or slots whose hole/slot diameter is successively tapered along the longitudinal axis of the waveguide, that is, the resonator is a nano-scale defect within a one-dimensional photonic-crystal lattice fabricated in the channel waveguide. Each device may be a P-Silicon/I-Silicon Germanium Tin/N-Silicon heterodiode pumped or controlled by lateral P-type and N-type Silicon wings that sandwich the resonator to form a lateral PIN heterodiode for current injection or high E-field application.

While the apparatus and method herein described constitute a preferred embodiment of the invention, it is to be understood that the invention is not limited to this precise form of apparatus or method and that changes may be made therein without departing from the scope of the invention which is defined in the appended claims.

I claim:

1. Nano-photonic communication link apparatus comprising the combination of:

an elongated optical waveguide member of selected infrared-wavelength-related length, width and depth nano-scale physical dimensions;

said elongated optical waveguide member including a plurality of lengthwise dispersed periodic cavity apertures depth wise received therein, the plurality of lengthwise dispersed periodic cavity apertures including an optically resonant waveguide cavity structure wherein successive groups of said lengthwise dispersed periodic cavity apertures form optical reflector elements;

said cavity apertures including periodic table group IV containing heterostructure filling material therein;

a plurality of central trench region inclusive similar resonant wavelength characterized active transducer regions each of distinguishable material composition dispersed in end regions and central region lengthwise segregation along said elongated optical waveguide member;

said active transducer regions also including a resonant wavelength selecting one of a small composition difference material characteristic and a similar material composition with differing physical strain characteristic;

an end region one of said active transducer regions comprising a laterally disposed electrically pumped PIN diode electroluminescent laser device optically coupling via said elongated optical waveguide member with remaining of said active transducer regions; and laterally extending electron and hole injecting transducer electrical signal communicating wing member appendages contiguous each of said active transducer regions.

2. The Nano-photonic communication link apparatus of claim 1 wherein said elongated optical waveguide member comprises a Silicon on insulator structure.

3. The Nano-photonic communication link apparatus of claim 2 wherein each said active transducer region wing member appendage includes one of a thin P-type Silicon wing structure and a laterally opposite thin N-type Silicon wing structure each adjacent said elongated optical waveguide member and an intrinsic hetero region intermediate said wings within said elongated optical waveguide member, said wings and said intrinsic hetero region comprising a hetero PIN diode.

4. The Nano-photonic communication link apparatus of claim 3 wherein said active transducer regions are three in number in said elongated optical waveguide member and comprise an optical signal generating laser, an optical signal modulator and an optical signal photo detector.

5. The Nano-photonic communication link apparatus of claim 4 wherein said elongated optical waveguide member includes a physical dimension depth of 0.5 to 0.7 lambda divided by n and a physical dimension width of lambda divided by n where lambda is a free space emission wavelength of said laser and n is a refractive index of said Silicon material.

6. The Nano-photonic communication link apparatus of claim 5 wherein said elongated optical waveguide member includes a rib depth that is thirty percent of said elongated optical waveguide member physical dimension depth.

7. The Nano-photonic communication link apparatus of claim 3 wherein each said hetero PIN diode includes a waveguide member lateral trench of length between lambda divided by n and two lambda divided by n and depth that is eighty percent of said elongated optical waveguide member physical dimension depth.

8. The Nano-photonic communication link apparatus of claim 7 wherein said elongated optical waveguide member plurality of central trench regions are filled with a first layer of Silicon, an overlying second buffer layer of Germanium$_{(1-x)}$Tin$_{(x)}$ alloy and an overlying third active layer of Germanium$_{(1-y)}$Tin$_{(y)}$ alloy.

9. The Nano-photonic communication link apparatus of claim 8 wherein said first layer of Silicon has a thickness depth of twenty percent of said elongated optical waveguide member physical dimension, said second buffer layer of Germanium$_{(1-x)}$Tin$_{(x)}$ alloy has a thickness depth of twenty percent of said elongated optical waveguide member physical dimension and said third active layer of Germanium$_{(1-y)}$Tin$_{(y)}$ alloy has a thickness depth of sixty percent of said elongated optical waveguide member physical dimension.

10. The Nano-photonic communication link apparatus of claim 4 wherein said optical signal generating laser, optical signal modulator and optical signal photo detector connect with sources of forward bias, reverse bias and reverse bias electrical operating potential respectively.

11. The Nano-photonic communication link apparatus of claim 4 wherein said elongated optical waveguide member lengthwise dispersed periodic cavity apertures are two in number and each comprise a Bragg mirror Fabry-Perot interferometer having one of five to seven periodic cavity aperture holes and five to seven periodic cavity aperture slots in a one-dimensional photonic-crystal lattice therein.

12. The Nano-photonic communication link apparatus of claim 11 wherein said optically resonant waveguide one-dimensional photonic-crystal lattice includes engineered mirror periodic cavity apertures of progressively increasing aperture size, optical Q of at least 1000 and low optical propagation loss along each central region to end region propagation.

13. The Nano-photonic communication link apparatus of claim 9 wherein said second buffer layer of Germanium$_{(1-x)}$Tin$_{(x)}$ alloy and said third active layer of Germanium$_{(1-y)}$Tin$_{(y)}$ alloy have Tin content selected each In response to an absorption edge wavelength characteristic of emission from said laser.

14. The Nano-photonic communication link apparatus of claim 13 wherein an unbiased fundamental absorption edge wavelength characteristic of said modulator is less than an unbiased absorption edge wavelength characteristic of said laser and an unbiased fundamental absorption edge wavelength characteristic of said optical signal photo detector is greater than an unbiased absorption edge wavelength characteristic of said laser.

15. The Nano-photonic communication link apparatus of claim 13 wherein said magnitudes of x in said Germanium$_{(1-x)}$Tin$_{(x)}$ alloy first layer and magnitudes of y in said Germanium$_{(1-y)}$Tin$_{(y)}$ alloy second layer are:
  x=0.04 for each of said laser, said modulator and said optical signal photo detector,
  y=0.04 for said laser;
  y=0.03 for said modulator; and
  y=0.07 for said photo detector.

16. The Nano-photonic communication link apparatus of claim 13 wherein said magnitudes of x in said Germanium$_{(1-x)}$Tin$_{(x)}$ alloy first layer and magnitudes of y in said Germanium$_{(1-y)}$Tin$_{(y)}$ alloy second layer are:
  x=y with y between 0.02 and 0.06 for said laser,
  y is 0.01 to 0.02 less than y of said laser for said modulator; and
  y is 0.02 to 0.04 more than y of said laser for said photo-detector.

17. The Nano-photonic communication link apparatus of claim 13 wherein said magnitudes of x in said Germanium$_{(1-x)}$Tin$_{(x)}$ alloy first layer and magnitudes of y in said Germanium$_{(1-y)}$Tin$_{(y)}$ alloy second layer are:
  y=0.00 for each of said laser, said modulator and said optical signal photo detector, said Germanium being of a tensile strained characteristic;
  x=0.05 for said laser;
  x=0.02 for said modulator; and
  x=0.09 for said photo detector.

18. The Nano-photonic communication link apparatus of claim 1 wherein said apparatus includes a resonator volume of substantially $1.4 V_0$, a $(\lambda/2n)^3$ volume of a reference resonator, for each of a plurality of PIN active diodes.

19. The Nano-photonic communication link apparatus of claim 1 wherein said link apparatus includes a lateral super lattice PIN laser diode and a strip waveguide formed from a material including one of silicon Germanium alloy on insulator, germanium on insulator and germanium tin alloy on insulator materials.

20. The Nano-photonic communication link apparatus of claim 1 wherein said link apparatus includes a one material super lattice laser having a laser cavity and said elongated optical waveguide member, each inclusive of one of intrinsic Silicon, Silicon Germanium alloy, Germanium and Germanium Tin alloy materials and having wing elements comprised of said same super lattice laser material.

21. The Nano-photonic communication link apparatus of claim 1 wherein said link apparatus includes an active region inclusive of three layers with a Silicon layer at a trench bottom, an unstrained Germanium-Tin buffer layer on said Silicon and a strain generating tensile Germanium layer on said Germanium-Tin.

22. The Nano-photonic communication link apparatus of claim 1 wherein said elongated optical waveguide member includes
  a Silicon on insulator resonant waveguide element located on an electrical insulator substrate member;
  said laser device in said resonant waveguide element includes a central trench region first micro cavity filled with selected Germanium inclusive semiconductor material;
  a first, laser transducer, contiguous of said wing member appendages includes a Silicon PIN diode portion of P doping received on said substrate adjacent said laser signal transducer element and in contact with a first side area of said resonant laser waveguide element;

a second, laser transducer, contiguous of said wing member appendages includes a Silicon PIN diode portion of N doping received on said substrate adjacent said laser signal transducer element and in contact with a second opposed side area of said resonant laser waveguide element;

said Silicon on insulator laser waveguide element also including a second lengthwise disposed photonic crystal structure region having a plurality of lengthwise adjacent photonic reflector elements defining a laser output signal coupled active electro absorption modulator lengthwise disposed in said waveguide element;

said laser output signal coupled active electro absorption modulator including a central trench region second micro cavity resonator filled with selected semiconductor material;

a third, electro absorption modulator stimulation, Silicon wing member PIN diode portion of P doping received on said substrate in contact with a third side region of said waveguide element adjacent said electro absorption modulator;

a fourth electro absorption modulator stimulation Silicon wing member PIN diode portion of N doping received on said substrate in contact with a fourth side region of said waveguide element adjacent said electro absorption modulator;

said Silicon on insulator laser waveguide element having a third lengthwise disposed one dimensional photonic crystal structure region inclusive of a plurality of lengthwise adjacent photonic reflector elements received therein to define an electro absorption modulator output signal fed and second transistor input port coupled active lengthwise photodetector third signal transducer region in said resonant waveguide element;

said third signal transducer region in said resonant waveguide element including a centrally disposed third micro cavity central trench region filled with selected semiconductor material;

a fifth photodetector stimulation Silicon wing member PIN diode portion of P doping received on said substrate in contact with a fifth side region of said waveguide element adjacent said photodetector third signal transducer; and a sixth photodetector stimulation Silicon wing member PIN diode portion of N doping received on said substrate in contact with a sixth side region of said waveguide element adjacent said photodetector third signal transducer.

23. The Nano-photonic communication link apparatus of claim 22 wherein said photonic reflector elements comprise successively tapered in hole diameter apertures located in axial sequence along said waveguide on lengthwise opposed sides of a selected micro cavity region.

24. The Nano-photonic communication link apparatus of claim 22 wherein said waveguide element is comprised of Silicon material and said central trench region includes one of Germanium, Germanium-Tin and Silicon-Germanium-Tin materials.

25. The Nano-photonic communication link apparatus of claim 22 wherein said waveguide element includes an underlying Silicon layer and further includes a Silicon Dioxide layer intermediate said substrate and said waveguide.

26. The Nano-photonic communication link apparatus of claim 25 wherein said Silicon Dioxide layer also underlies said wing member appendages P and N doping.

27. The Nano-photonic communication link apparatus of claim 22 wherein said lengthwise adjacent photonic reflector elements comprise successively tapered in diameter circular apertures in said Silicon on insulator laser waveguide element.

28. The Nano-photonic communication link apparatus of claim 22 wherein said lengthwise adjacent photonic reflector elements comprise axially disposed differing rectangular dimension apertures in said Silicon on insulator laser waveguide.

29. The Nano-photonic communication link apparatus of claim 22 wherein said second and third Silicon wing member PIN diode portions comprise elements of a Franz-Keldysh modulation apparatus.

30. The Nano-photonic communication link apparatus of claim 22 wherein said first, second and third signal transducer elements each include multiple mode resonance characteristics.

31. The Nano-photonic communication link apparatus of claim 22 wherein each of said laser, electro absorption modulator and photodetector elements is comprised of identical materials and wherein said identical materials include a different degree of tensile strain in each said laser, electro absorption modulator and photodetector element.

32. The Nano-photonic communication link apparatus of claim 31 wherein each of said laser, electro absorption modulator and photodetector element includes a differing degree of semiconductor heat treatment accomplished tensile strain.

33. The Nano-photonic communication link apparatus of claim 22 wherein said laser, electro absorption modulator and photodetector elements include a first proportion of Tin in said electro absorption modulator element, a second increased proportion of Tin in said laser element and a third greater increased proportion of Tin in said photodetector element.

34. The Nano-photonic communication link apparatus of claim 1 wherein each said transducer region includes a first and second array of said periodic cavity apertures and wherein said periodic cavity apertures comprise one of waveguide holes, tapered holes, slots and side corrugations and wherein said periodic cavity apertures include one of air and Germanium inclusive filling material.

35. The Nano-photonic communication link apparatus of claim 1 wherein said central trench region has a length dimension along said waveguide of between one and three periodic cavity aperture spacings.

36. The Nano-photonic communication link apparatus of claim 1 wherein said central trench region includes a Silicon, periodic table Group IV material, Silicon heterostructured filling material.

37. The Nano-photonic communication link apparatus of claim 36 wherein said central trench region periodic table Group IV material is comprised of Germanium.

38. The Nano-photonic communication link apparatus of claim 1 wherein said elongated optical waveguide member includes intrinsic Silicon and Germanium materials.

* * * * *